(12) United States Patent
Ueyanagi et al.

(10) Patent No.: US 7,119,657 B2
(45) Date of Patent: Oct. 10, 2006

(54) POLYSILICON RESISTOR SEMICONDUCTOR DEVICE

(75) Inventors: Katsumichi Ueyanagi, Nagano (JP);
Mutsuo Nishikawa, Nagano (JP);
Katsuyuki Uematsu, Nagano (JP)

(73) Assignee: Fuji Electric Co., Ltd., (JP)

( * ) Notice: Subject to any disclaimer, the term of this patent is extended or adjusted under 35 U.S.C. 154(b) by 204 days.

(21) Appl. No.: 10/120,211

(22) Filed: Apr. 10, 2002

(65) Prior Publication Data

US 2002/0175379 A1 Nov. 28, 2002

(30) Foreign Application Priority Data

Apr. 13, 2001 (JP) ............................. 2001-116063
Dec. 21, 2001 (JP) ............................. 2001-389375

(51) Int. Cl.
*H01C 1/012* (2006.01)
*H01C 7/06* (2006.01)

(52) U.S. Cl. .......................................... 338/309; 338/7

(58) Field of Classification Search .................... 338/7, 338/8, 9, 307, 309, 308, 314
See application file for complete search history.

(56) References Cited

U.S. PATENT DOCUMENTS

| | | | | |
|---|---|---|---|---|
| 4,446,613 A * | 5/1984 | Beinglass et al. | ............ | 438/384 |
| 5,013,686 A * | 5/1991 | Choi et al. | ................. | 438/385 |
| 5,257,005 A * | 10/1993 | Desroches et al. | .......... | 338/325 |
| 5,656,524 A * | 8/1997 | Eklund et al. | .............. | 438/238 |
| 5,705,436 A * | 1/1998 | Chin et al. | .................. | 438/238 |
| 6,140,910 A * | 10/2000 | Smith et al. | ................ | 338/309 |
| 6,211,769 B1 * | 4/2001 | Baldwin et al. | .............. | 338/7 |
| 6,251,777 B1 * | 6/2001 | Jeng et al. | ................... | 438/682 |
| 6,316,816 B1 * | 11/2001 | Matsumoto | ................. | 257/538 |
| 6,400,252 B1 * | 6/2002 | Smith et al. | ................ | 338/308 |
| 6,433,717 B1 * | 8/2002 | Leung | ........................ | 341/144 |
| 6,455,392 B1 * | 9/2002 | Maimon et al. | ........... | 438/382 |
| 2001/0036722 A1 * | 11/2001 | Yoo et al. | | |
| 2001/0045594 A1 * | 11/2001 | Chang | | |
| 2002/0000660 A1 * | 1/2002 | Sharan et al. | | |

FOREIGN PATENT DOCUMENTS

| | | |
|---|---|---|
| JP | 9-232521 | 9/1997 |
| JP | 11-150010 | 6/1999 |
| JP | 11-330365 | 11/1999 |

* cited by examiner

*Primary Examiner*—Tu Hoang
(74) *Attorney, Agent, or Firm*—Rossi, Kimms & McDowell, LLP

(57) ABSTRACT

A semiconductor device includes a polysilicon resistor that can suppress variations in resistance value in environments with an ambient temperature higher than room temperature. The resistance value $R_{con}$ of a polysilicon contact is reduced to 2% or less of the sum of the resistance value $R_{con}$ of the polysilicon contact and the resistance value $R_{poly}$ of a polysilicon resistor. Hence, a semiconductor device that is not significantly affected by a variation in the resistance of the polysilicon contact is realized. This device suppresses variations in resistance value in environments with an ambient temperature higher than room temperature.

12 Claims, 5 Drawing Sheets

POLYSILICON RESISTOR SEMICONDUCTOR DEVICE

FIELD OF THE INVENTION

The present invention relates to a semiconductor device, and in particular, to a semiconductor device comprising a polysilicon resistor used as a resistance element in various semiconductor integrated circuits for automobiles, measurements, or calibrations that are used in high-temperature environments.

BACKGROUND OF THE INVENTION

In a semiconductor integrated circuits, factors affecting the occurrence of electromigration, which may deform a conductor or cause the circuit to malfunction, are known to include element density, temperature, and crystal structure as explained in Takashi TOMIZAWA and Yasuo MATSUYAMA "Principle Of COMOSVLS1 Design—From the Viewpoint Of Systems," Maruzen Co., Ltd., pp. 122, incorporated herein by reference. The adverse effects of temperature have not been sufficiently examined, so that specific constraints on temperature and the like are unknown.

For semiconductor integrated circuits used for automobiles or plant measurements or in other high-temperature environments (i.e., temperatures higher than room temperature), the effects of temperatures stress on the semiconductor integrated circuit must be sufficiently considered. In particular, with a sensor or similar device that amplifies a generated analog minor signal by 50- to 1000-fold depending on a detected physical amount, when the resistance value of a conductor through which the minor signal propagates varies, this effect is directly amplified. Thus, such a device reacts sensitively to changes in the resistance of a portion with a fine sectional structure such as a polysilicon contact that electrically connects a polysilicon resistor to a metal wire.

Earlier designs have proposed that a variation in the resistance value of the polysilicon resistor or a variation in contact resistance be suppressed. For example, Japanese Patent Application Publication No. 9-232521, incorporated herein by reference, discloses a semiconductor device in which the resistance value of the polysilicon resistor is adjusted by monitoring this value, while performing thermal treatment in order to diffuse impurities through a borosilicate glass (BSG) film over the polysilicon resistor, as well as a manufacturing method therefor. Furthermore, Japanese Patent Application Publication No. 11-150010, incorporated herein by reference, discloses a method of adjusting the resistance value by regulating the position of the contact between the polysilicon resistor and the metal wire. To cite yet another example, Japanese Patent Application Publication No. 11-330365, incorporated herein by reference, discloses a semiconductor device in which a variation in contact resistance is restrained by forming a nitride film over the polysilicon resistor to suppress damage caused by over-etching of the polysilicon resistor when a contact hole is opened, as well as a manufacturing method therefor. All of these proposals attempt to realize, during the manufacturing stage, a resistance value as close to a design value as possible, and are not intended to suppress variations over time in resistance value in high-temperature environments.

The effects of temperature on a polysilicon resistor were examined as follows. The polysilicon resistor was electrically connected to the metal wire via a polysilicon contact, and these components were constructed using a procedure commonly used for semiconductor integrated circuits. As a result, it was determined that if a semiconductor device composed of a conventional polysilicon resistor and a conventional polysilicon contact is left in high-temperature environments, the resistance value of the polysilicon resistor varies more significantly than diffusion resistance, as shown in FIG. 9.

This is due to the fact that the resistance value of the polysilicon contact varies sharply in high-temperature environments, for example, when the temperature of the environment is higher than room temperature. FIG. 9 is a graph showing variations in the resistance value of the polysilicon resistor and the resistance value of the diffused resistor in the semiconductor device composed of the conventional polysilicon resistor when the device was left at 220° C. The maximum temperature at which semiconductor integrated circuits for automobiles or the like are operated is approximately 150° C., but acceleration tests were conducted with the temperature set at a larger value.

Accordingly, if such a semiconductor device composed of a conventional polysilicon resistor is used in an amplifying circuit used in high-temperature environments, amplifying rate varies over time in this high-temperature environment, making it difficult to maintain reliability over an extended period.

The present invention is provided to solve the above referred problems, with a semiconductor device comprising a polysilicon resistor having a resistance value that does not vary substantially even in high-temperature environments.

SUMMARY OF THE INVENTION

A polysilicon resistor semiconductor device according to the present invention is characterized in that the resistance value $R_{poly}$ of the polysilicon resistor and the total resistance value $R_{con}$ of the polysilicon contact meets the relationship represented by the expression shown below. The value $R_{poly}$ corresponds to the resistance between a polysilicon contact disposed at one end of the polysilicon resistor and a polysilicon contact disposed at the other end. Furthermore, the value $R_{con}$ includes the resistance of a metal film in a contact hole that electrically connects the metal wire and the polysilicon resistor together as well as the resistance of portions of the metal film and polysilicon resistor that are in mutual contact, but primarily corresponds to the resistance value of the contact portions, as this resistance is dominant.

An inequality demonstrating the relationship between $R_{con}$ and $R_{poly}$ is calculated as follows:

$$R_{con}/(R_{poly}+R_{con}) \leq 0.02\ (2\%)$$

This semiconductor device is used as a resistance element in an analog circuit integrated on the same integrated circuit, particularly an amplifying circuit that amplifies an electric signal output from a sensor element. This amplifying circuit is used in high-temperature environments and included in, for example, integrated circuits for automobiles, measurements, or calibrations.

According to the present invention, the resistance value $R_{con}$ of the polysilicon contact is reduced to 2% or less of the sum of the resistance value $R_{con}$ of the polysilicon contact and the resistance value $R_{poly}$ of the polysilicon resistor. Consequently, a semiconductor device can be provided that is not significantly affected by variations in the resistance of the polysilicon contact.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Figure 1:
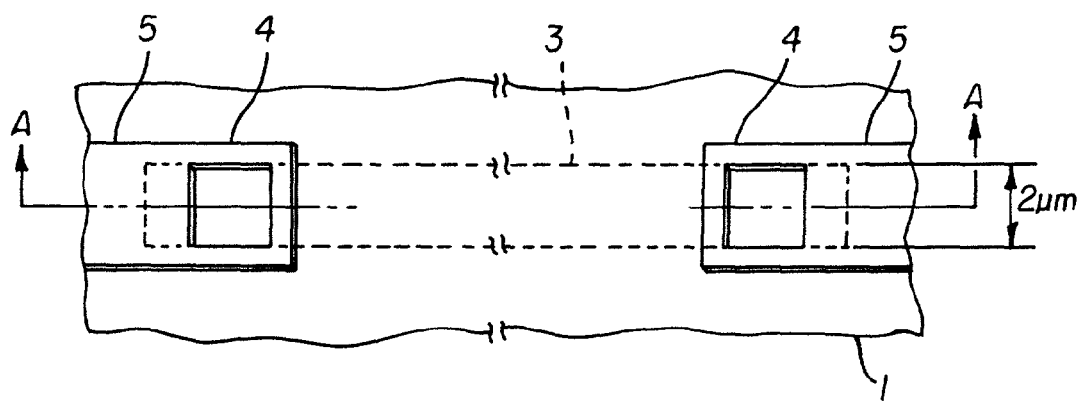
FIG. 1 is a plan view schematically showing the configuration of a semiconductor device used in an embodiment of the present invention and comprised of a first polysilicon resistor.
Figure 2:
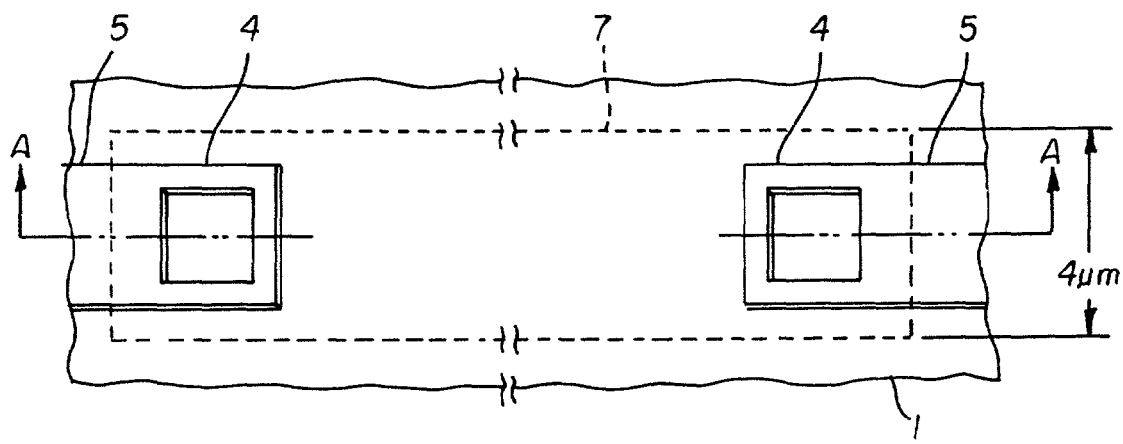
FIG. 2 is a plan view schematically showing the configuration of a semiconductor device used in the embodiment of the present invention and comprised of a second polysilicon resistor.
Figure 3:
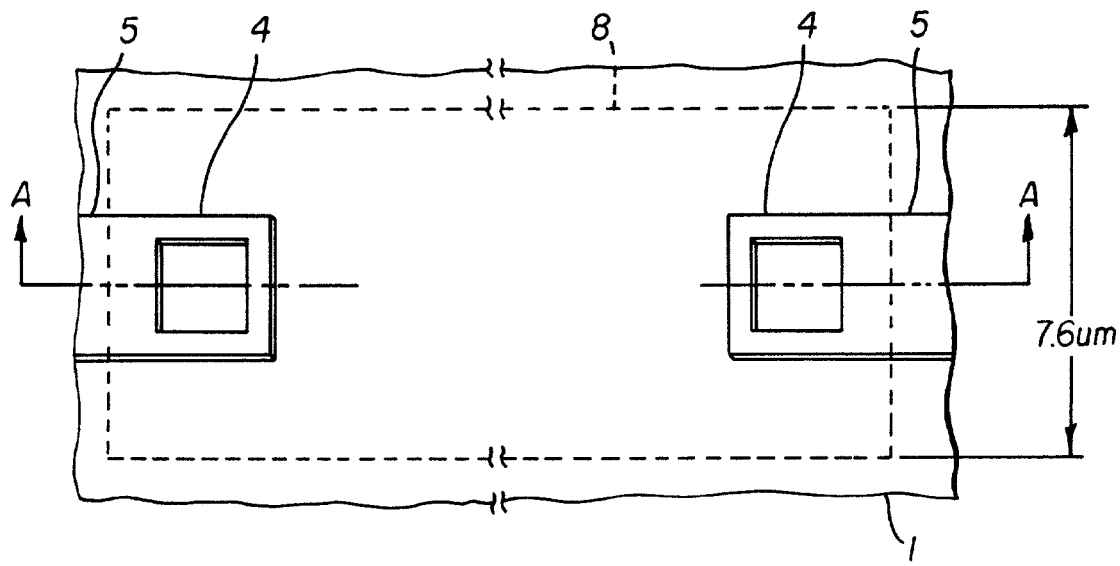
FIG. 3 is a plan view schematically showing the configuration of a semiconductor device used in the embodiment of the present invention and comprised of a third polysilicon resistor.
Figure 4:
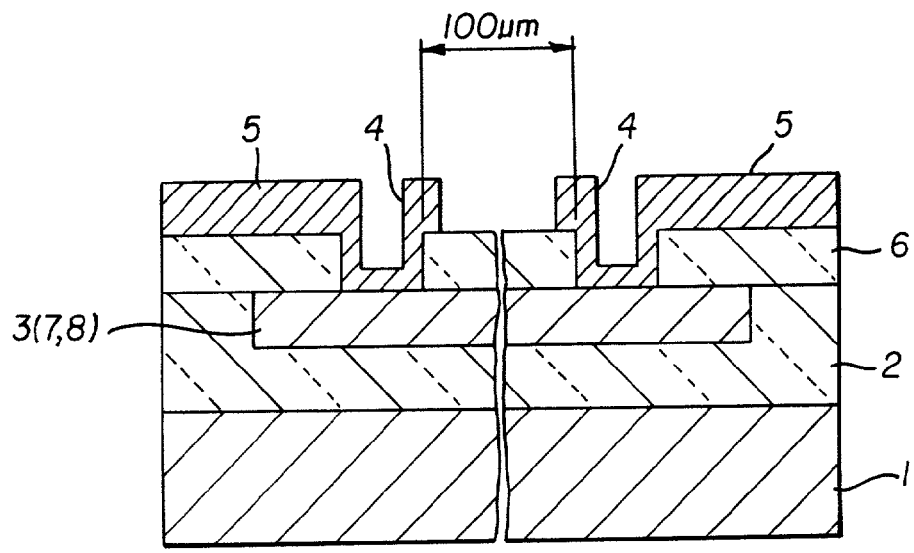
FIG. 4 is a vertical sectional view taken along line A—A in FIGS. 1 to 3.
Figure 5:
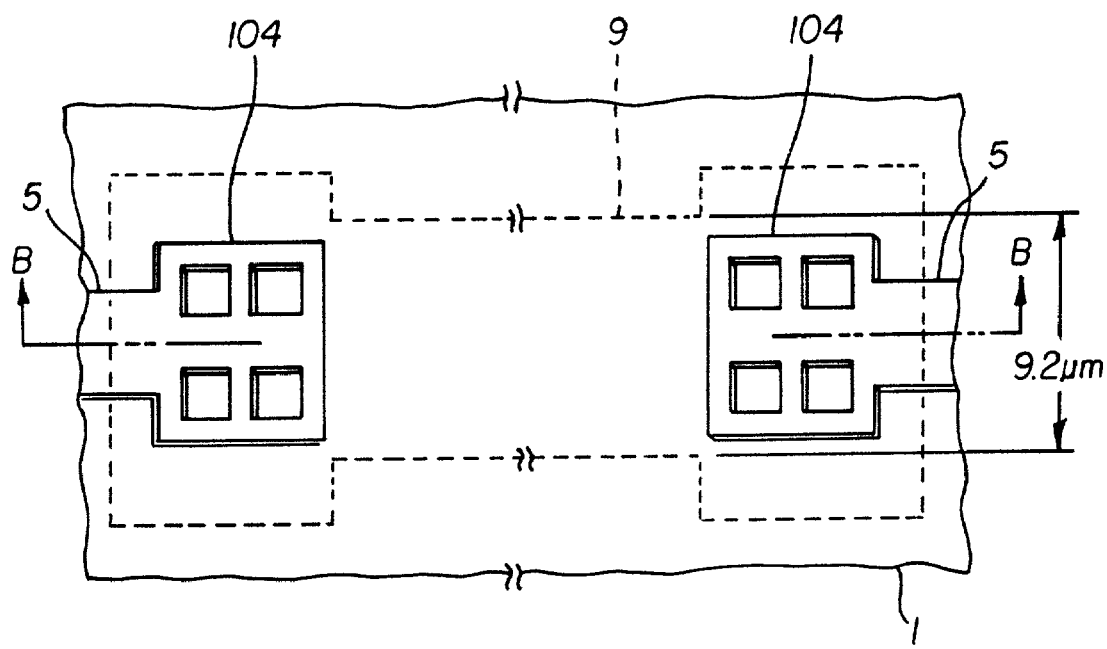
FIG. 5 is a plan view schematically showing the configuration of a semiconductor device used in the embodiment of the present invention and comprised of a fourth polysilicon resistor.
Figure 6:
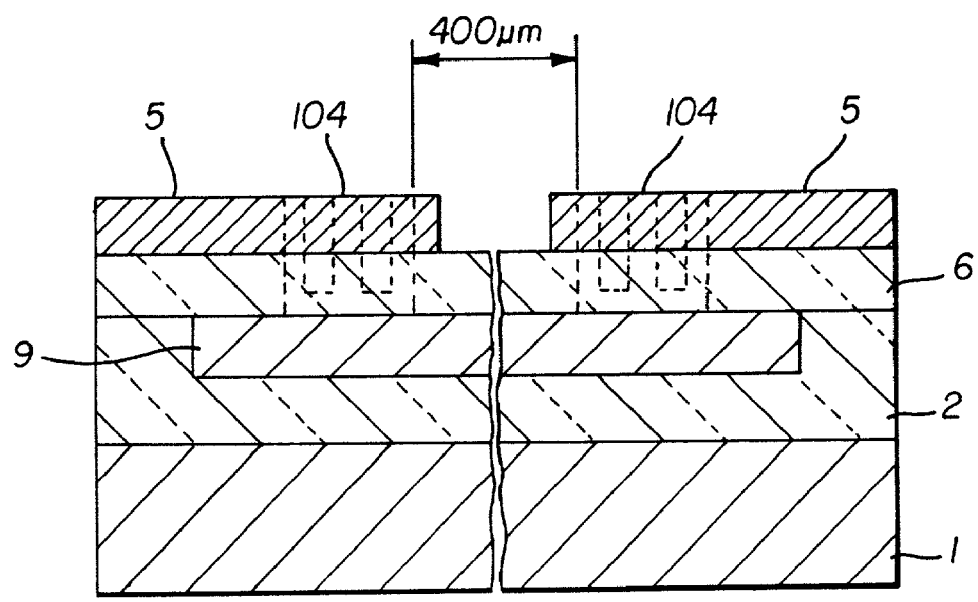
FIG. 6 is a vertical sectional view taken along line B—B in FIG. 5.

In accordance with the present invention, four polysilicon resistor semiconductor devices comprising a first, a second, a third, and a fourth device, described below, were prepared. FIGS. 1 to 3 consist of plan views schematically showing the configurations of the semiconductor devices comprising the first, second, and third polysilicon resistors. These three semiconductor devices have the same configurations, except for the width and the resistance value of the polysilicon resistor. Accordingly, these semiconductor devices have the same vertically sectional structure along line A—A in FIGS. 1 to 3, as shown in FIG. 4. FIGS. 5 and 6 consist of plan views of the fourth polysilicon resistor semiconductor device, schematically showing the configuration of the device and a vertical sectional view taken along line B—B, respectively. In FIGS. 1 to 6, the relative sizes and lengths of the components are not drawn to scale.

As shown in FIGS. 1 and 4, the polysilicon resistor semiconductor device comprising the first polysilicon resistor has a rectangular polysilicon resistor 3 formed on a semiconductor substrate 1 via an insulated film 2 of borophosphosilicate glass (BPSG), phosphosilicate glass (PSG), or similar substances. Substantial ends of the polysilicon resistor 3 are each electrically connected to a metal wire 5 of aluminum or the like via a polysilicon contact 4 penetrating an interlayer insulated film 6 such as an oxide film. The polysilicon contact 4 is formed of a metal film deposited on the inner surface of the contact hole when the metal wire 5 is formed. In this case, the polysilicon resistor 3 has a width of 2 μm (see FIG. 1). The distance between the polysilicon contacts 4, 4, that is, the length of the portion contributing to the resistance value $R_{poly}$ of the polysilicon resistor 3 is 100 μm (see FIG. 4). In this case, if the polysilicon resistor has a sheet resistance of 31 Ω/□, the polysilicon resistance $R_{poly}$ has a value of 1.55 kΩ.

Furthermore, the size of the polysilicon contact 4, or the size of the opening of the contact hole, is set according to a design rule, and in this case is 2×2 μm. The contact resistance $R_{con}$ is 54 Ω per contact. Consequently, the value $R_{con}/(R_{poly}+R_{con})$ is approximately 7%. Since the size (2×2 μm) of the polysilicon contact 4 is set according to the design rule, it applies to the semiconductor devices comprising the second to the fourth polysilicon resistors, as described below.

In the polysilicon resistor semiconductor device comprising the second polysilicon resistor, shown in FIG. 2, a polysilicon resistor 7 has a width of 4 μm (see FIG. 2), and in this case, the resistance $R_{poly}$ has a value of 790 Ω. Accordingly, in this example, the value $R_{con}/(R_{poly}+R_{con})$ is approximately 12%. Furthermore, in the semiconductor device comprising the third polysilicon resistor, shown in FIG. 3, a polysilicon resistor 8 has a width of 7.6 μm (see FIG. 3), and the resistance $R_{poly}$ has a value of 400 Ω. Accordingly, in this example, the value $R_{con}/(R_{poly}+R_{con})$ is approximately 21%. Furthermore, in these two cases, the size of the opening of the contact hole is also 2×2 μm, and the contact resistance $R_{con}$ is 54 Ω per contact.

In the polysilicon resistor semiconductor device comprising the fourth polysilicon resistor, as shown in FIGS. 5 and 6, a polysilicon resistor 9 has a width of 9.2 μm, and the minimum distance between polysilicon contacts 104, 104 on the polysilicon resistor 9 is 400 μm. In this case, the resistance $R_{poly}$ has a value of 1.35 KΩ. Accordingly, the value $R_{con}/(R_{poly}+R_{con})$ is 1.96%. Since the shape of the contact hole is set according to the design rule and the contact resistance is 54Ω per contact, a plurality of contact holes may be formed in order to obtain the desired value $R_{con}$ of the contact resistance. In the example shown in FIG. 5, four contact holes are formed on each side of the device.

The bottom surface of each polysilicon contact 104, which is in contact with the polysilicon resistor 9, is covered with a metal film obtained by depositing the same metal (e.g., aluminum) as that of the metal wire 5 on the inner surface of the contact hole when the metal wire 5 is formed. The inner surface of the opening of the polysilicon contact 104 is flattened using the same material as that of an interlayer insulated film or a passivation film (not shown) when this film is formed.

To connect the contacts 104 to the polysilicon resistor 9, those areas of the polysilicon resistor 9, where connection is made with the respective contacts 104, may each be formed to be slightly larger than the corresponding contact 104.

To set the resistance $R_{poly}$ of the polysilicon resistor 9 to the desired value and meet the condition $R_{con}/R_{poly}+R_{con})$ ≦2%, the value of the contact resistance $R_{con}$ may be specified. If the design rule specifies the shape of the contact hole, the value may be adjusted according to the number of contact holes.

Figure 7:
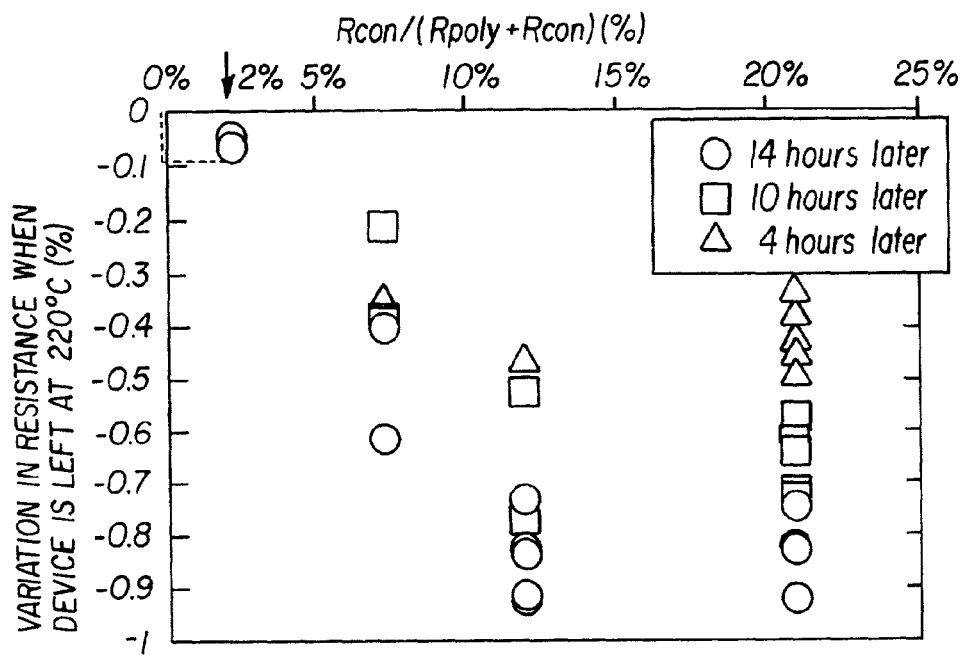
FIG. 7 is a graph showing the results of high-temperature acceleration tests on the semiconductor devices composed of the first to fourth polysilicon resistors.

Groups of plural semiconductor devices each were provided in which the groups comprised different polysilicon resistors including the first to fourth polysilicon resistors constructed as described above. These semiconductor devices were left at a high temperature of 220° C. and subjected to an acceleration test. The resistance value was measured after 4, 10, and 14 hours had elapsed. The results are shown in FIG. 7. In this figure, a group of plots for which the value $R_{con}/(R_{poly}+R_{con})$ is approximately 7% have been obtained from the semiconductor device comprising the first polysilicon resistor, shown in FIG. 1. A group of plots of which the value $R_{con}/(R_{poly}+R_{con})$ is approximately 12% have been obtained from the semiconductor device comprising the second polysilicon resistor, shown in FIG. 2. A group of plots for which the value $R_{con}/(R_{poly}+R_{con})$ is approximately 21% have been obtained from the semiconductor device comprising the third polysilicon resistor, as shown in FIG. 3. A group of plots for which the value $R_{con}/(R_{poly}+R_{con})$ is approximately 2% have been obtained from the semiconductor device comprising the fourth polysilicon resistor, as shown in FIG. 5.

FIG. 7 indicates that regardless of the value $R_{con}/(R_{poly}+R_{con})$, a variation in resistance value increases consistently with the time for which the semiconductor device is left and with the value $R_{con}/(R_{poly}+R_{con})$. If a variation in resistance value is to be reduced to 0.1% or less at high temperature (which is, for example, higher than room temperature), the value $R_{con}/(R_{poly}+R_{con})$ may be set at approximately 2% or less, as shown in FIG. 7.

Figure 9:
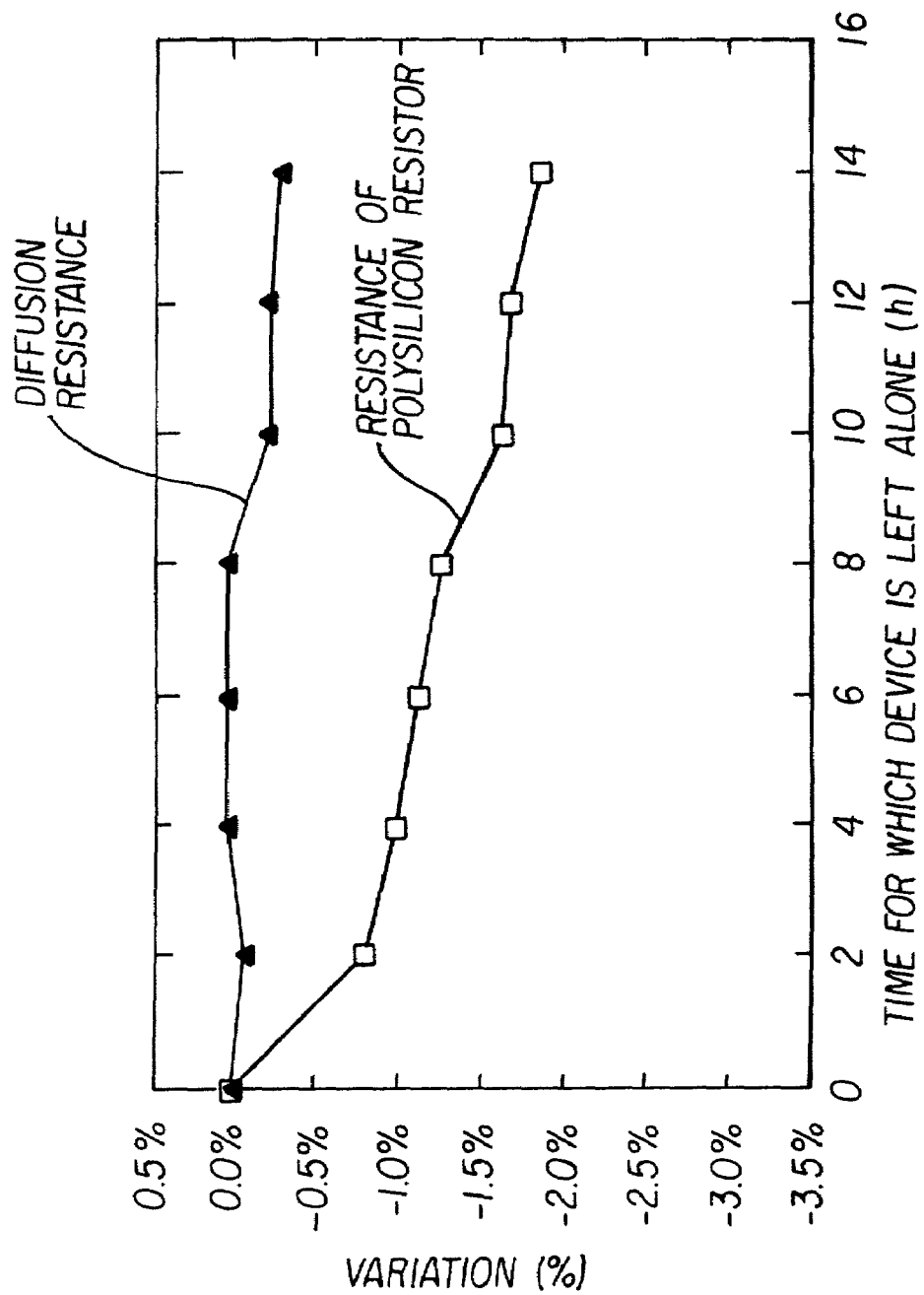
FIG. 9 is a graph showing the results of tests conducted by the inventors of the present invention to compare variations in the resistance value of a conventional polysilicon resistor with a variation in diffusion resistance value when the semiconductor device is left at 220° C.

The value $R_{con}/(R_{poly}+R_{con})$ is not limited to 2% or less, but may be appropriately determined according to the desired variations in resistance value with reference to FIG. 7. In other words, if an allowable value for a variation in resistance value is larger than 0.1%, the value $R_{con}/(R_{poly}+R_{con})$ may be larger than 2%. In contrast, if the allowable value for a variation in resistance value is smaller than 0.1%, the value $R_{con}/(R_{poly}+R_{con})$ is smaller than 2%. In this connection, in a semiconductor device composed of a conventional polysilicon resistor and a conventional polysilicon contact, as shown in FIG. 9, the value $R_{con}/(R_{poly}+R_{con})$ is 30%.

Figure 8:
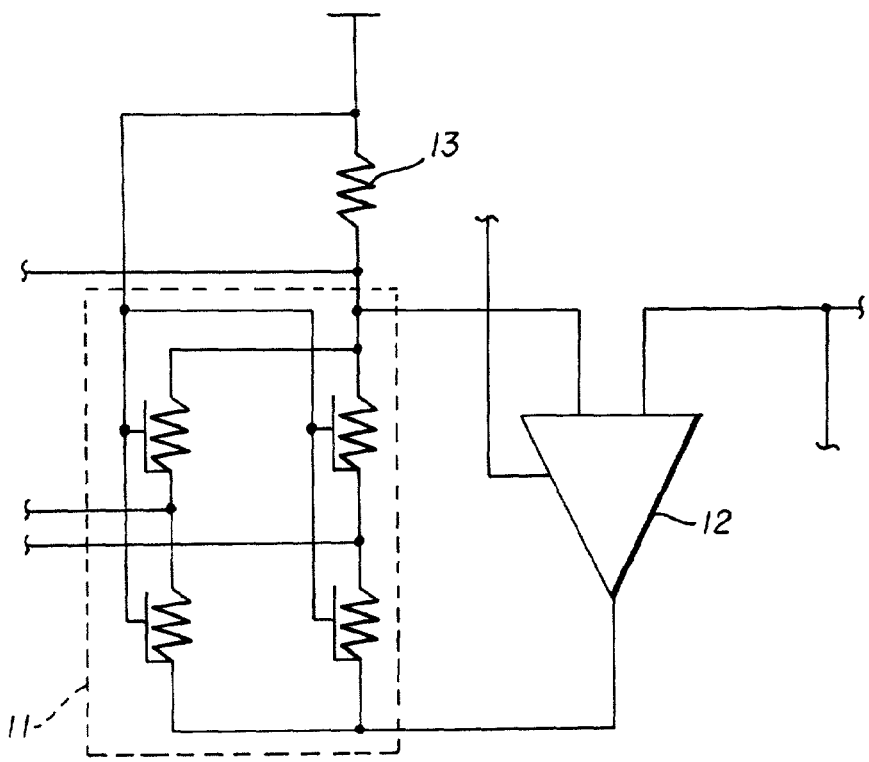
FIG. 8 is a circuit diagram showing essential parts of an example of an analog circuit to which the semiconductor device composed of the polysilicon resistor according to the present invention has been applied.

An explanation will be provided regarding a sample analog circuit to which the semiconductor device according to the present invention has been applied. FIG. 8 is a circuit diagram showing essential parts of this analog circuit. This analog circuit constitutes a part of a sensor device comprising a sensor element that detects pressure, temperature, acceleration, sound, or light and then outputs an electric signal corresponding to the detected intensity. In FIG. 8, reference numeral 11 denotes a gauge circuit constituting the sensor element, reference numeral 12 denotes an amplifier that amplifies an output signal from the gauge circuit 11, and reference numeral 13 denotes a resistance element composed of the semiconductor device according to the present invention, that is, a resistance element made of polysilicon and designed so that its value $R_{con}/(R_{poly}+R_{con})$ is 2% or less. The resistance element 13 is produced on the same semiconductor substrate together with the gauge circuit 11 and the amplifier 12.

According to the above described embodiment, the value $R_{con}/(R_{poly}+R_{con})$ is reduced to 2% or less, thereby providing a semiconductor device that is not significantly affected by a variation in the resistance of the polysilicon contact. Consequently, a semiconductor device that comprises a polysilicon resistor having a resistance value that does not substantially vary even if the semiconductor device is used in high-temperature environments (i.e., temperatures higher than room temperature) is realized. The use of this semiconductor device realizes a semiconductor integrated circuit that can withstand high temperatures and that remains reliable over a long period. In particular, this is effective as a resistance element for various semiconductor integrated circuits for automobiles, plant measurements, or calibrations that are used in high-temperature environments (e.g., temperatures higher than room temperature).

In the above description, it is apparent that the present invention is not limited to the above described embodiments. That is, the sizes and resistance values of the polysilicon resistors 3, 7, 9, and 9, as shown in FIGS. 1 to 6, are illustrative, and may vary in accordance with actual design as long as the condition $R_{con}/(R_{poly}+R_{con}) \leq 2\%$ is met.

According to the present invention, the resistance value $R_{con}$ of the polysilicon contact is reduced to 2% or less of the sum of the resistance value $R_{con}$ of the polysilicon contact and the resistance value $R_{poly}$ of the polysilicon resistor. Hence, a semiconductor device that is not significantly affected by variations in the resistance of the polysilicon contact is realized. Consequently, a semiconductor device that comprises a polysilicon resistor having a resistance value that does not substantially vary even if the semiconductor device is used in high-temperature environments is realized. Furthermore, the use of this semiconductor device realizes a semiconductor integrated circuit that can withstand high temperature and remain reliable over a long period.

What is claimed is:

1. A semiconductor device comprising:
   a semiconductor substrate;
   a polysilicon resistor having two ends and formed on the semiconductor substrate via an insulating film; and
   two conductors each having multiple contacts and electrically connected to the polysilicon resistor close to a respective end thereof via the respective multiple contacts,
   wherein the resistance value $R_{poly}$ of the polysilicon resistor and the total resistance value $R_{con}$ of the multiple contacts of the two conductors have the following relations:

$$R_{con}/(R_{poly}+R_{con}) \leq 2\%.$$

2. A semiconductor device according to claim 1, wherein each of the multiple contacts of the two conductors comprises a contact hole.

3. A semiconductor device according to claim 1, wherein an integrated analog circuit is formed on the semiconductor substrate and the polysilicon resistor works as a resistance element of the analog circuit.

4. A semiconductor device according to claim 2, wherein an integrated analog circuit is formed on the semiconductor substrate and the polysilicon resistor works as a resistance element of the analog circuit.

5. A semiconductor device according to claim 3, wherein said analog circuit is an amplifying circuit connected to a sensor element that generates an electric signal corresponding to a detected physical amount to amplify an electric signal from the sensor element.

6. A semiconductor device according to claim 4, wherein said analog circuit is an amplifying circuit connected to a sensor element that generates an electric signal corresponding to a detected physical amount to amplify an electric signal output from the sensor element.

7. A semiconductor device according to claim 5, wherein said amplifying circuit is included in an integrated circuit for automobiles that is used in high-temperature environments.

8. A semiconductor device according to claim 6, wherein said amplifying circuit is included in an integrated circuit for automobiles that is used in high-temperature.

9. A semiconductor device according to claim 5, wherein said amplifying circuit is included in an integrated circuit for measurements that is used in high-temperature environments.

10. A semiconductor device according to claim 6, wherein said amplifying circuit is included in an integrated circuit for measurements that is used in high-temperature environments.

11. A semiconductor device according to claim 5, wherein said amplifying circuit is included in an integrated circuit for calibrations that is used in high-temperature environments.

12. A semiconductor device according to claim 6, wherein said amplifying circuit is included in an integrated circuit for calibrations that is used in high-temperature environments.

* * * * *